United States Patent [19]

Koo

[11] 4,001,050
[45] Jan. 4, 1977

[54] METHOD OF FABRICATING AN ISOLATED P-N JUNCTION

[75] Inventor: Tuh-Kai Koo, Colorado Springs, Colo.

[73] Assignee: NCR Corporation, Dayton, Ohio

[22] Filed: Nov. 10, 1975

[21] Appl. No.: 630,490

[52] U.S. Cl. .............................. 148/1.5; 148/187; 148/188; 357/90; 357/91

[51] Int. Cl.² ..................................... H01L 21/383

[58] Field of Search .................. 148/1.5, 187, 188; 357/90, 91

[56] References Cited

UNITED STATES PATENTS

| | | | |
|---|---|---|---|
| 3,685,140 | 8/1972 | Engeler | 148/188 X |
| 3,717,507 | 2/1973 | Abe | 148/1.5 |
| 3,729,811 | 5/1973 | Beale et al. | 148/1.5 X |
| 3,756,861 | 9/1973 | Payne et al. | 148/1.5 |
| 3,856,578 | 12/1974 | Payne et al. | 148/1.5 |
| 3,891,480 | 6/1975 | Fulkerson | 148/187 |
| 3,898,105 | 8/1975 | Mai et al. | 148/1.5 |

Primary Examiner—L. Dewayne Rutledge
Assistant Examiner—J. M. Davis
Attorney, Agent, or Firm—J. T. Cavender; Lawrence P. Benjamin

[57] ABSTRACT

A method of forming dielectrically isolated islands of semiconductor material on which discrete devices may be formed is disclosed. A wafer of semiconductive material is provided with an oxide layer and, by ion implantation, is lightly doped after which, openings are formed in the oxide. The portions of wafer exposed by the openings are then heavily doped and the wafer is then subjected to a high temperature step to drive in the dopants and produce isolated areas.

10 Claims, 8 Drawing Figures

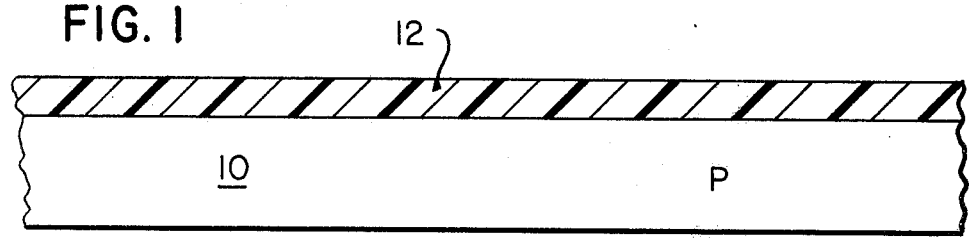
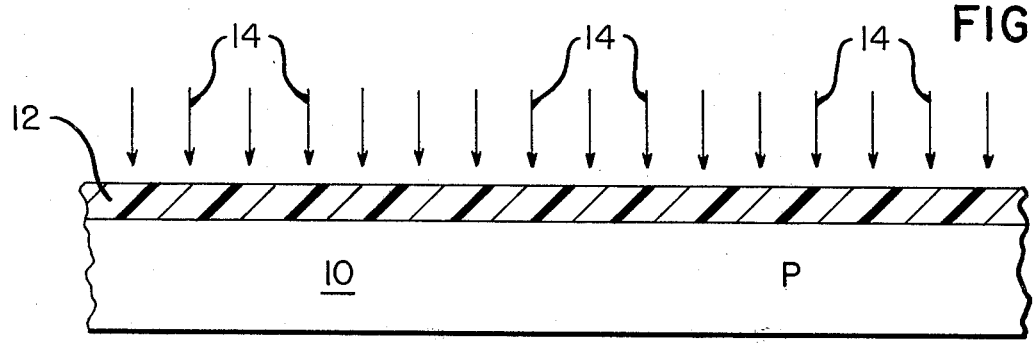
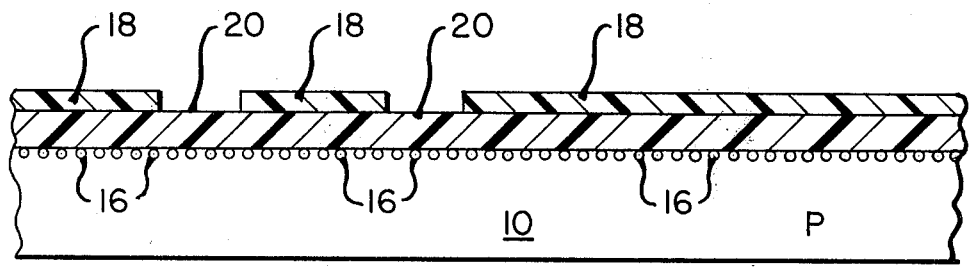
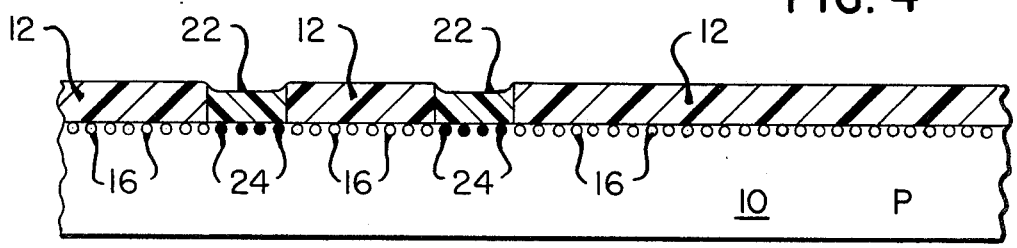

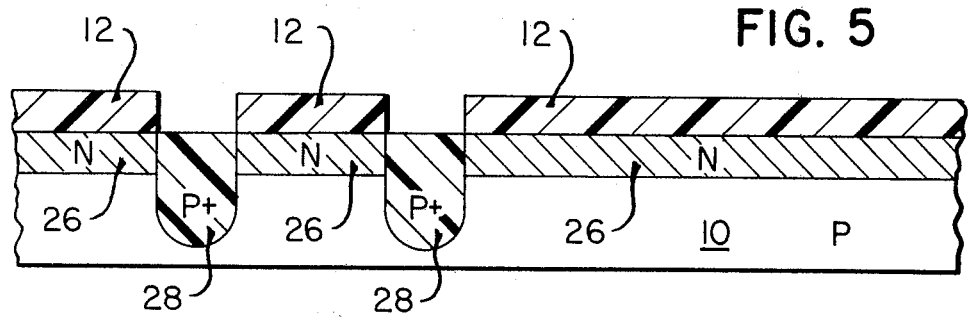
FIG. 5
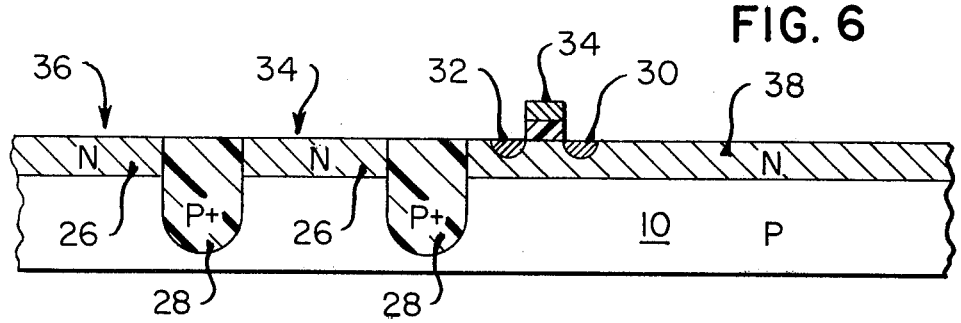
FIG. 6
FIG. 7
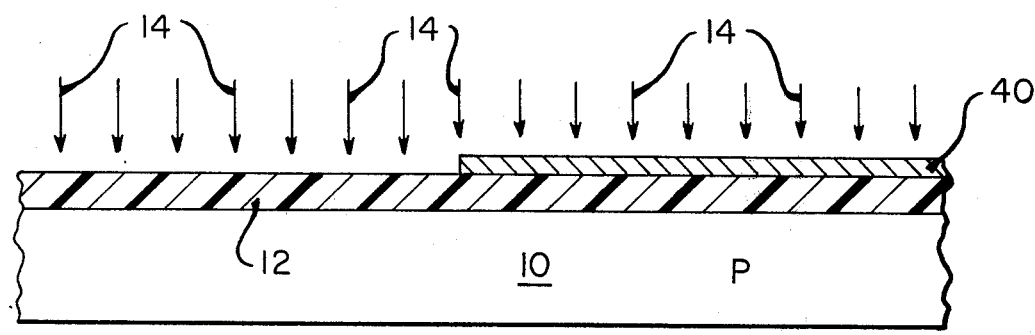
FIG. 8
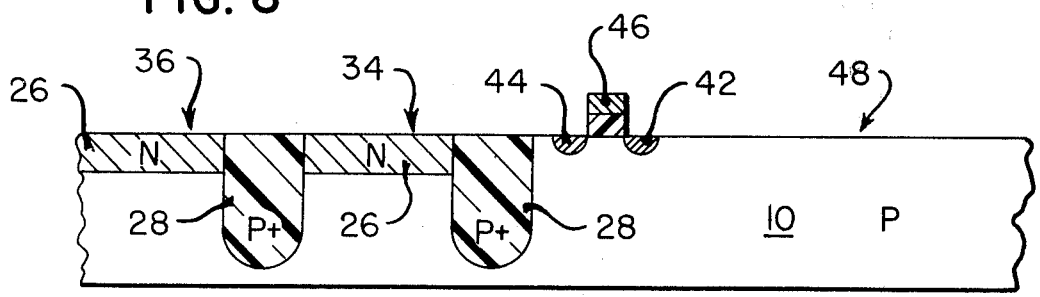

METHOD OF FABRICATING AN ISOLATED P-N JUNCTION

BACKGROUND OF THE INVENTION

This invention relates to integrated circuits and more particularly to monolithic integrated circuits having circuit components formed on a common substrate and which are electrically isolated from each other throughout the substrate.

As used herein, the expression "monolithic integrated circuit" refers to a single substrate or wafer of semiconductive material which may, typically, be monocrystalline. Individual active or passive components are formed on the surface of the wafer and, when appropriately interconnected, results in the desired circuit network. Accordingly, such circuit networks require electrical isolation between the various circuit components formed on the wafer.

As discussed in my co-pending patent application Ser. No. 618,717, filed on or about Oct. 1, 1975, entitled "Dielectrically Isolated Semiconductor Device" and assigned to the assignee of the subject application, I disclose a method wherein a semiconductor wafer of one conductivity is processed to have an epitaxial layer of semiconductive material of an opposite conductivity on the surface of the wafer. A nitride layer is then formed over the epitaxial layer. The processing includes etching a first set of parallel grooves through the nitride layer and partially through the epitaxial layer, after which, a second set of parallel grooves are etched through the nitride layer across the first set of grooves. The grooved wafer is then subjected to an oxidation step to convert the exposed grooved portions to an insulating oxide. The resulting structure is one having a first set of grooves that extend completely through the epitaxial layer to the wafer and a second set of crossing grooves that extend only partially through the epitaxial layer. Since the grooves are filled with an insulator material, discrete "islands" are thus formed which are electrically isolated one from another.

After the dielectrically isolated islands have been formed, by any method of manufacture, active or passive circuits are formed in or on the exposed surface of the islands and interconnecting leads are then formed on the surface of the device for connection to the various elements of the individual circuits. However, in the prior art manufacture of these integrated circuits, it has been found that a significant portion of the total area of the wafer is occupied by the isolation regions between adjacent islands. Since large areas of isolation reduce the number of active devices in a given, fixed area, the resultant chip will have an undesirably lower packing density.

In instances where isolation between semiconductor devices, either of the bipolar transistor type or MOS, is required, the isolation of islands by regions of dielectric insulation is highly desirable. The foregoing technique represents an improvement in both my co-pending application as well as the prior art in that, by using a combination of ion implantation and diffusion, I am able to accommodate complimentary (C-MOS) devices which require the aforementioned isolation. In addition, by using the foregoing technique, I am also able to accommodate various other types of active devies, such as, for example, diodes. Additionally, my novel process can provide a higher packing density of the final monolithic integrated circuit than heretofore possible, since less area is required for the isolation regions.

SUMMARY OF THE INVENTION

Briefly, and in accordance with the teachings of the present invention, a semiconductor wafer, of a given conductivity, is provided with an oxide layer after which, the wafer is then subjected to an ion implantation, through the oxide layer, to lightly dope the wafer just below the oxide interface. Thereafter, openings are provided in the oxide layer to expose those portions of the wafer that will subsequently represent the isolation areas. A dopant, which will produce an insulator, is then introduced into the opening formed in the oxide and the entire wafer is then subjected to a high temperature "drive-in". As a result of heavily doping the wafer, at the openings in the oxide, the high temperature drive-in will result in deep wells of insulating material which effectively isolate the areas between the deep wells from the remainder of the wafer. In contrast, the areas of the wafer subjected to ion implantation have already been lightly doped and, therefore, during the drive-in step will not penetrate the thickness of the wafer as deeply as the adjacent heavily doped areas.

It is, therefore, one object of the present invention to provide a device that has been manufactured by the combination of ion implantation and diffusion techniques to produce electrically isolated islands.

Another principal object of the present invention is to produce a semiconductor device having a higher packing density than heretofore possible.

BRIEF DESCRIPTION OF THE DRAWINGS

FIGS. 1–5 depict, in a somewhat schematic cross-section, the various views of a portion of a wafer during the processing steps utilizing my invention;

FIG. 6 depicts a somewhat schematic cross-sectional view of the utilization of one embodiment of my invention;

FIG. 7 depicts a somewhat schematic cross-sectional view of an intermediate step in the fabrication of another embodiment of my invention;

FIG. 8 depicts a somewhat schematic cross-sectional view of the utilization of another embodiment of my invention.

DETAILED DESCRIPTION OF THE PREFERRED EMBODIMENTS

Referring now to FIG. 1, there is shown a wafer 10 which may be silicon. It will be obvious to those skilled in the art that after reading the foregoing exegesis that any type of silicon crystal orientation (<100>, <110> or <111>) may be utilized. As indicated, wafer 10 is provided with a layer of silicon oxide 12 which, for example, may be grown in steam at a temperature of about 1200° C for a period of time sufficient to produce an oxide thickness of approximately 2000 A. Oxide layer 12 need only be of sufficient thickness to prevent damage to wafer 10 during a subsequent ion implantation.

Thereafter, as shown in FIG. 2, oxide coated layer 10 is subjected to ion implantation (as indicated by arrows 14) to lightly implant phosphorous in wafer 10 just below the interface of oxide layer 12. In this step, I have found that by maintaining the ion implantation device at approximately 50 Kv and by using phosphine gas as the phosphorous source I have been able to achieve the desired results.

Referring now to FIG. 3, wafer 10 is now shown as being lightly implanted with phosphorous atoms (herein shown as circles 16) and covered with a photoresistive layer 18 which serves as a mask for oxide layer 12. Openings are provided in layer 18 to define those areas of wafer 10 which subsequently will be processed as isolation areas. Thereafter, the wafer is subjected to a standard oxide etch to etch away the exposed areas 20 of oxide layer 12.

After etching oxide layer 12, to expose portions of wafer 10, the next step in my process requires that the now exposed portions of the wafer be heavily doped to produce the isolation wells. This is done by utilizing Boron Tribromide ($BBr_3$) at a furnace temperature of about 1050° C ± 10° C. Nitride is used as a principal carrier flowing at the rate of approximately 2,900 cc per minute together with oxygen flowing at the rate of about 20 cc per minute through a bubbler containing 99.99% $BBr_3$, the bubbler being maintained at about 24° C. The result of the exposure to $BBr_3$ is the formation of boron glass 22 deposited in the openings and the presence of boron atoms in the wafer immediately below the openings. The boron atoms are here depicted as dots 24. Thereafter, once the boron atoms 24 are deposited in wafer 10, just below the interface of wafer 10 and boron glass 22, boron glass 22 may be removed by etching. The etchant that may be used is one which combines approximately 3500 ml of ammonium fluoride combined with 500 ml of hydrogen fluoride to produce an etchant commonly referred to as a "7:1" etch solution.

Thereafter, as shown in FIG. 5, my device is subjected to a high temperature drive-in wherein the wafer is placed in a furnace that is maintained at about 1,200° C ± 100° C, for a period of about 4 hours. As a result, the boron atoms will be driven in to a depth of about 10 microns while the phosphorous will be driven in approximately 1.5 microns. By so doing, I have been able to provide N-type areas 26 in P substrate 10 by reason of the presence of phosphorous atoms 16 and I am also able to produce the P-wells 28 by reason of the presence of boron atoms 24.

Thereafter, my device is now prepared for subsequent fabrication and, as shown, by way of example in FIG. 6, by providing drain and source regions 20 and 32 together with gate portion 34, a P channel FET may be fabricated in area 38 adjacent a pair of diode areas 34 and 36.

It should now become obvious to those skilled in the art that various other modifications may be made herein without departing from the inventive concept. One such modification is to utilize an N-type substrate in place of the P-type substrate 10 shown in the Figures. Another embodiment of my device, which should now become apparent, appears in the formation of, for example, a complimentary-MOS (C-MOS) field effect transistor. To accomplish this, one merely has to implant or diffuse into the N-type area 38 of FIG. 6 an appropriate dopant to convert the N-type material shown to a P-type material. However, to avoid that additional step one merely has to provide sufficient masking to prevent any implantation of the phosphorous atoms. This is shown in more detail in FIG. 7 wherein metallic mask 40 is shown covering the oxide areas to be protected. In this latter event, one may utilize either molybdenum or aluminum to fill the areas to be protected from the ion implantation. Thereafter, the device is processed as shown and described in FIGS. 3, 4 and 5 to produce the deep wells 28 and the N regions 26. Thereafter, appropriate N-type material is diffused into the previously protected areas 98 of wafer 10 to produce drain and source 42 and 44 which, when combined with gate 46, will result in an N-channel MOSFET. This N channel device, together with a P channel device which may be formed in area 34, will result in the complimentary MOS configuration desired.

What is claimed is:

1. A method of forming a semiconductor device comprising the steps of:
   providing a semiconductor wafer of given conductivity;
   implanting a given concentration of a first dopant, of an impurity of the opposite type of conductivity, under the surface of the wafer;
   thermally diffusing a second dopant, of the given conductivity, into selected areas on the surface of the wafer, the second dopant concentration being greater than the concentration of the first dopant;
   driving the first and second dopant into the wafer.

2. The method of claim 1 wherein the step of driving the first and second dopants into the wafer comprises:
   heating the surface doped wafer at an elevated temperature wherein the second dopant penetrates the wafer, in the thickness direction, deeper than the first dopant.

3. A method of forming a semiconductor device comprising the steps of:
   providing a semiconductor wafer of a given conductivity;
   growing a layer of oxide on one surface of the wafer;
   implanting a given concentration of a first dopant, of the opposite type conductivity, in the wafer below the interface with the oxide;
   masking selected portions of the implanted surface of the wafer, the unmasked portion representing areas to be isolated;
   thermally diffusing a second dopant, of the given conductivity, into the unmasked portions of the wafer;
   driving the first and second dopants into the wafer;
   removing the layer of oxide;
   removing the mask; and
   forming active devices on the portions of the wafer surface that were masked.

4. The method of claim 3 wherein the step of driving the first and second dopants into the wafer comprises:
   heating the surface doped wafer at an elevated temperature wherein the second dopant penetrates the wafer, in the thickness direction, deeper than the first dopant.

5. The method of claim 4 wherein:
   the first dopant is implanted over the entire surface of the wafer below the interface with the oxide; and
   the active devices are formed by diffusing areas of first conductivity in the previously masked portion of the wafer.

6. The product formed by the process of claim 5.

7. The method of claim 4 wherein:
   the first dopant is implanted in the area of the wafer to be isolated; and
   the active devices are formed by diffusing areas of second conductivity into the wafer in the portions that were not implanted with the first dopant.

8. The product formed by the process of claim 7.

9. The method of claim 4 comprising the further step of:
providing the oxide with an ion impervious mask to prevent the implantation of ions of the first dopant into areas of the wafer.

10. The method of claim 9 comprising the further step of:
forming active devices in the unimplanted area of the wafer by diffusing areas of second conductivity therein.

* * * * *